(12) United States Patent
Kanatzidis et al.

(10) Patent No.: US 12,266,733 B2
(45) Date of Patent: Apr. 1, 2025

(54) METHODS FOR GROWING DOPED CESIUM LEAD HALIDES

(71) Applicant: Northwestern University, Evanston, IL (US)

(72) Inventors: Mercouri G. Kanatzidis, Wilmette, IL (US); Yihui He, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 18/219,821

(22) Filed: Jul. 10, 2023

(65) Prior Publication Data

US 2023/0378388 A1    Nov. 23, 2023

Related U.S. Application Data

(63) Continuation of application No. 17/523,141, filed on Nov. 10, 2021, now Pat. No. 11,749,771, which is a continuation of application No. 16/644,404, filed as application No. PCT/US2018/049708 on Sep. 6, 2018, now Pat. No. 11,195,967.

(60) Provisional application No. 62/555,248, filed on Sep. 7, 2017.

(51) Int. Cl.
| | |
|---|---|
| *H01L 31/08* | (2006.01) |
| *C30B 11/00* | (2006.01) |
| *C30B 29/12* | (2006.01) |
| *G01T 1/24* | (2006.01) |
| *H01L 31/0224* | (2006.01) |
| *H01L 31/032* | (2006.01) |

(52) U.S. Cl.
CPC .......... *H01L 31/085* (2013.01); *C30B 11/003* (2013.01); *C30B 29/12* (2013.01); *G01T 1/24* (2013.01); *H01L 31/0224* (2013.01); *H01L 31/032* (2013.01)

(58) Field of Classification Search
CPC ...... H01L 31/085; C30B 11/003; C30B 29/12
See application file for complete search history.

(56) References Cited

U.S. PATENT DOCUMENTS

| | | | |
|---|---|---|---|
| 8,519,347 B2 | 8/2013 | Kanatzidis et al. | |
| 9,181,475 B2 | 11/2015 | Kanatzidis et al. | |
| 10,889,756 B2 * | 1/2021 | Lüchinger | C09K 11/7705 |

(Continued)

FOREIGN PATENT DOCUMENTS

| | | |
|---|---|---|
| CN | 110628428 A | 12/2019 |
| CN | 210129523 U | 3/2020 |

(Continued)

OTHER PUBLICATIONS

Protesescu et al., Nanocrystals of Cesium Lead Halide Perovskites (CsPbX3, X = Cl, Br, and I): Novel Optoelectronic Materials Showing Bright Emission with Wide Color Gamut, DOI: 10.1021/nl5048779 Nano Lett. 2015, 15, 3692-369, pubs.acs.org/NanoLett (Year: 2015).*

Liu, Shun-Chang, et al. "Investigation of oxygen passivation for high-performance all-inorganic perovskite solar cells." *Journal of the American Chemical Society* 141.45 (2019): 18075-18082.

(Continued)

*Primary Examiner* — Hugh Maupin
(74) *Attorney, Agent, or Firm* — Bell & Manning, LLC

(57) ABSTRACT

Methods and devices for detecting incident radiation are provided. The methods and devices use high quality single-crystals of photoactive semiconductor compounds in combination with metal anodes and metal cathodes that provide for enhanced photodetector performance.

9 Claims, 13 Drawing Sheets

(56) References Cited

U.S. PATENT DOCUMENTS

| | | | |
|---|---|---|---|
| 2005/0285041 A1* | 12/2005 | Srivastava | G21K 4/00 250/361 R |
| 2013/0320836 A1 | 12/2013 | Kanatzidis et al. | |
| 2016/0141535 A1* | 5/2016 | Snaith | H10K 71/10 438/82 |
| 2017/0084400 A1* | 3/2017 | Cheng | C30B 29/54 |
| 2017/0217785 A1* | 8/2017 | Yang | C01G 19/006 |
| 2018/0208840 A1* | 7/2018 | Lüchinger | C09D 11/50 |
| 2018/0218845 A1* | 8/2018 | Tan | H10K 71/12 |
| 2019/0074140 A1* | 3/2019 | Saidaminov | H01G 9/2009 |
| 2020/0161127 A1* | 5/2020 | Irwin | H10K 85/50 |
| 2023/0203372 A1 | 6/2023 | Lin | |

FOREIGN PATENT DOCUMENTS

| | | | |
|---|---|---|---|
| WO | WO 2019/051056 A1 | 3/2019 | |
| WO | WO 2019/195873 A1 | 10/2019 | |
| WO | WO 2021/226191 A1 | 11/2021 | |

OTHER PUBLICATIONS

Huang, Like, et al. "Oxygen-induced defect-healing and photo-brightening of halide perovskite semiconductors: science and application." *Journal of Materials Chemistry A* 9.8 (2021): 4379-4414.

Haotong Wei et al., "Halide lead perovskites for ionizing radiation detection," Nature Communications (2019) 10:1066; https://doi.org/10.1038/s41467-019-08981-w; pp. 1-12.

Jinlu He et al., "Superoxide/Peroxide Chemistry Extends Charge Carriers' Lifetime but Undermines Chemical Stability of $CH_3NH_3PbI_3$ Exposed to Oxygen: Time-Domain ab Initio Analysis," *J. Am. Chem. Soc.* 2019, 141, 5798-5807.

Liu, Shun-Chang, et al. Supporting Information for: "Investigation of oxygen passivation for high-performance all-inorganic perovskite solar cells." Journal of the American Chemical Society 141.45 (2019): S1-S16.

Indika U. Arachchige et al., "Mercouri G. Kanatzidis: Excellence and Innovations in Inorganic and Solid-State Chemistry," *Inorg. Chem.* 2017, 56, 7582-7597.

* cited by examiner

Work function of elements (eV)

| | | | | | |
|---|---|---|---|---|---|
| Ag | 4.26 – 4.74 | Al | 4.06 – 4.26 | As | 3.75 |
| Au | 5.10 – 5.47 | B | ~4.45 | Ba | 2.52 – 2.70 |
| Be | 4.98 | Bi | 4.31 | C | ~5 |
| Ca | 2.87 | Cd | 4.08 | Ce | 2.9 |
| Co | 5 | Cr | 4.5 | Cs | 1.95 |
| Cu | 4.53 – 5.10 | Eu | 2.5 | Fe | 4.67 – 4.81 |
| Ga | 4.32 | Gd | 2.90 | Hf | 3.90 |
| Hg | 4.475 | In | 4.09 | Ir | 5.00 – 5.67 |
| K | 2.29 | La | 3.5 | Li | 2.9 |
| Lu | ~3.3 | Mg | 3.66 | Mn | 4.1 |
| Mo | 4.36 – 4.95 | Na | 2.36 | Nb | 3.95 – 4.87 |
| Nd | 3.2 | Ni | 5.04 – 5.35 | Os | 5.93 |
| Pb | 4.25 | Pd | 5.22 – 5.60 | Pt | 5.12 – 5.93 |
| Rb | 2.261 | Re | 4.72 | Rh | 4.98 |
| Ru | 4.71 | Sb | 4.55 – 4.70 | Sc | 3.5 |
| Se | 5.9 | Si | 4.60 – 4.85 | Sm | 2.7 |
| Sn | 4.42 | Sr | ~2.59 | Ta | 4.00 – 4.80 |
| Tb | 3.00 | Te | 4.95 | Th | 3.4 |
| Ti | 4.33 | Tl | ~3.84 | U | 3.63 – 3.90 |
| V | 4.3 | W | 4.32 – 5.22 | Y | 3.1 |
| Yb | 2.60[13] | Zn | 3.63 – 4.9 | Zr | 4.05 |

FIG. 9

| No. | Starting material | Doping species (at.%) | Growth method | Speed or cooling rate |
|---|---|---|---|---|
| YH2052 | CsBr+PbBr$_2$ | Se, 0.2% | Vertical Bridgman | 1 mm/h |
| YH2053 | CsBr+PbBr$_2$ | PbCl$_2$, 0.5% | Vertical Bridgman | 1 mm/h |
| YH2054 | CsBr+PbBr$_2$ | PbCl$_2$, 1% | Vertical Bridgman | 1 mm/h |
| YH2055 | CsBr+PbBr$_2$ | PbCl$_2$, 5% | Vertical Bridgman | 1 mm/h |
| YH2057 | CsBr+PbBr$_2$ | Te, 0.5% | Horizontal cooling | 30 K/h |
| YH2058 | CsBr+PbBr$_2$ | Bi, 0.1% | Horizontal cooling | 30 K/h |
| YH2059 | CsBr+PbBr$_2$ | TlBr, 0.5% | Horizontal cooling | 30 K/h |
| YH2060 | CsBr+PbBr$_2$ | PbCl$_2$, 5% | Horizontal cooling | 30 K/h |
| YH2061 | CsBr+PbBr$_2$ | In, 0.2 % | Horizontal cooling | 30 K/h |
| YH2062 | CsBr+PbBr$_2$ | InBr, 0.5 % | Horizontal cooling | 30 K/h |
| YH2063 | CsBr+PbBr$_2$ | Ga, 0.2 % | Horizontal cooling | 30 K/h |
| YH2064 | CsBr+PbBr$_2$ | Sb, 0.2 % | Horizontal cooling | 30 K/h |
| YH2065 | CsBr+PbBr$_2$ | Pb, 1%; PbBr$_2$, 1% | Vertical Bridgman | 0.7 mm/h |
| YH2066 | CsBr+PbBr$_2$ | Pb, 1%; PbBr$_2$, 5% | Vertical Bridgman | 0.7 mm/h |
| YH2067 | CsBr+PbBr$_2$ | Pb, 5%; PbBr$_2$, 5% | Vertical Bridgman | 0.7 mm/h |
| YH2020 | CsBr+PbBr$_2$ | Pb, 0.5% | Vertical Bridgman | 0.5 mm/h |
| YH2088 | CsBr+PbBr$_2$ | TlBr, 0.05% | Vertical Bridgman | 0.5 mm/h |
| YH2078 | CsBr+PbBr$_2$ | CsSnBr$_3$, 0.5% | Vertical Bridgman | 0.5 mm/h |
| YH2074 | CsCl+PbCl$_2$ | - | Vertical Bridgman | 0.7 mm/h |
| YH2075 | CsCl+PbCl$_2$ | PbBr$_2$, 1% | Vertical Bridgman | 0.7 mm/h |

FIG. 10

METHODS FOR GROWING DOPED CESIUM LEAD HALIDES

CROSS-REFERENCE TO RELATED APPLICATIONS

The present application is a continuation of U.S. patent application Ser. No. 17/523,141 that was filed on Nov. 10, 2021, the entire contents of which are incorporated herein by reference, which is a continuation of U.S. patent application Ser. No. 16/644,404 that was filed on Mar. 4, 2020, now U.S. Pat. No. 11,195,967, the entire contents of which are incorporated herein by reference, which is a National Stage of International application number PCT/US2018/049708 that was filed Sep. 6, 2018, the entire contents of which are hereby incorporated by reference, which claims priority to U.S. provisional patent application No. 62/555,248 that was filed Sep. 7, 2017, the entire contents of which are hereby incorporated herein by reference.

REFERENCE TO GOVERNMENT RIGHTS

This invention was made with government support under 2014-DN-077-ARI086-01 awarded by the Department of Homeland Security. The government has certain rights in the invention.

BACKGROUND

The demand for high performance radiation detectors based on compound semiconductors is high, owing to their broad potential applications in the fields of homeland security, industrial and medical imaging, and fundamental scientific research. Previously developed materials have remained in use for decades, as the search for low-cost, promising compounds with desirable properties, such as high density, high atomic number (Z), suitable bandgap ($E_g$), high electrical resistivity ($\rho$) and high mobility-lifetime ($\mu\tau$) product, has continued. To ensure sufficient charge collection efficiency (CCE) and high resolution of the energy resolved spectrum, the mean free path ($\mu\tau E$) of the materials should be much larger than the thickness of the device under a certain electrical field E. This means the charge carriers must move through the detector volume unimpeded, and also implies the need for extremely low concentrations of electrically-active and carrier-trapping defects.

Because high performance radiation detectors require such specific, correlated properties, only a few conventional compounds (binary chalcogenides and halides) have been found that have demonstrated an encouraging spectroscopic response. In addition, only a few compounds have been developed with a view toward commercial applications, due to the difficulties or high cost in obtaining high-quality, reproducible, single crystals. Among these, CdTe and CdTe-related pseudo-binary compounds (such as CdZnTe), $\alpha$-$HgI_2$ and TlBr have been developed intensely. However, each of these compounds has suffered from persistent unsolved issues related to either crystal growth or device operation.

Halide perovskites have attracted a lot of interest in the fields of photoelectrical conversion, such as photovoltaic applications, photo detection and photoemission. The structures of the halide perovskites are very diverse and form a large family, depending on various anions and cations. Among these, the all-inorganic perovskite $CsPbBr_3$, with a relatively large bandgap of 2.25 eV, has been proved to be feasible for growth to a large size from its melt, and also from solutions. The strong coupling between cation lone-pair Pb s orbitals and anion p orbitals results in a unique electronic band structure, resulting in an extraordinarily dispersive band structure for both conduction and valence bands.

SUMMARY

Photodetectors for detecting incident radiation, such as incident gamma-rays and incident nuclear radiation, are provided.

One embodiment of a photodetector includes: single-crystalline $CsPbX_3$, where X represents Br or Cl; at least one metal anode in electrical communication with the $CsPbX_3$, wherein the metal of the metal anode is selected from the group consisting of gallium, chromium, titanium, indium, indium-calcium alloys, lead, aluminum, magnesium and alloys of two or more thereof; at least one metal cathode in electrical communication with the $CsPbX_3$, wherein the metal of the cathode is selected from gold, platinum, nickel, osmium, palladium, and alloys of two or more thereof; wherein the anode and cathode are configured to apply an electric field across the material; and a detector configured to measure a signal generated by electron-hole pairs that are formed when the material is exposed to incident gamma radiation and/or nuclear radiation.

BRIEF DESCRIPTION OF THE DRAWINGS

Illustrative embodiments of the invention will hereafter be described with reference to the accompanying drawings, wherein like numerals denote like elements.

FIG. 9 lists various metal electrode materials, along with their work functions.

FIG. 10 is a table listing different doping compositions for $CsPbX_3$ (X=Cl, Br) compounds.

FIG. 12C. The detector performance under $^{57}Co$ γ-ray spectra obtained by $CsPbBr_3$ detectors fabricated from the ingot after zone refining and subsequent Bridgman growth. The Bridgman growth parameters were the same for the crystals FIG. 12B and FIG. 12C.

DETAILED DESCRIPTION

Figure 1:
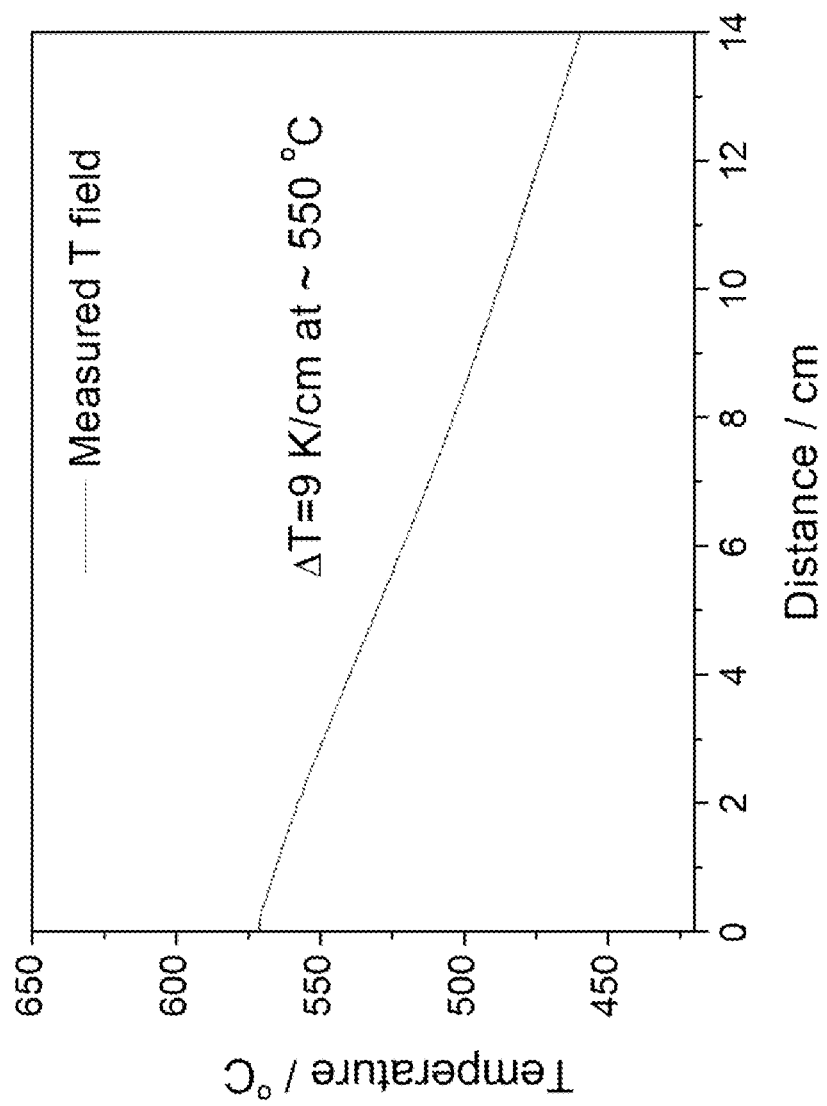
FIG. 1 depicts an optimized temperature profile used for Bridgman growth of $CsPbBr_3$ single crystals, as described in the Example.

Materials, photodetectors, and methods for detecting incident radiation, such as incident gamma-rays and incident nuclear radiation, are provided. Embodiments of the methods and photodetectors allow for high spectroscopic resolution of the gamma-rays from radioactive elements and X-ray sources. For example, embodiments of the methods and photodetectors are able to provide spectroscopic resolution (energy resolution) of 6% or better at a specific energy of 122 KeV, in terms of full width at half maximum (FWHM), as illustrated in the Example. This includes methods and photodetectors that provide spectroscopic resolutions of 5% or better, and methods and photodetectors that provide spectroscopic resolutions of 4.5% or better, at a specific energy of 122 KeV, in terms of FWHM.

Some embodiments of the inventions described herein are based, at least in part, on the inventors' discovery that certain anode/cathode pairs can be used with the photoactive materials in the photodetectors to provide significantly improved device performance.

One embodiment of a photodetector comprises: a material comprising a photoactive, single-crystalline semiconductor; a metal anode in electrical communication with the material; a metal cathode in electrical communication with the material, wherein the anode and cathode are configured to apply an electric field across the material; and a detector configured to measure a signal generated by electron-hole pairs that are formed when the material is exposed to incident gamma radiation and/or nuclear radiation. By way of illustration only, one such photodetector comprises a gallium anode, a gold cathode, and a $CsPbBr_3$ photoactive layer.

One embodiment of a method for the detection of incident radiation using a photodetector, such as that described immediately above, comprises the steps of: exposing the photoactive, single-crystalline semiconductor to incident radiation, wherein the material absorbs the incident gamma radiation and/or nuclear radiation and electron-hole pairs are generated in the material; and measuring at least one of the energy or intensity of the absorbed incident radiation by detecting the generated electrons and/or holes. During the operation of the photodetector, an electrical voltage is applied to the cathode, which collects the signal, and the anode is grounded. Or, during the operation of the photodetector, the electrical voltage is applied to the anode, which collects the signal, and the cathode is grounded.

A variety of photoactive semiconductors can be used, wherein the term photoactive semiconductor refers to a semiconductor material that absorbs gamma radiation or nuclear radiation and generates a photocurrent.

The photoactive semiconductor may be an all-inorganic semiconductor or an organic-inorganic semiconductor. For example, the photoactive semiconductor can be a photoactive perovskite, such as a halide perovskite having the formula $AMX_3$, where A is a monovalent alkylammonium cation (for example, methylammonium, formamidinium, or a combination thereof) or an alkali metal cation (Group I cation), X is a halide ion, and M is an octahedrally coordinated bivalent metal atom. Examples of all-inorganic perovskites include compounds such as $CsPbBr_3$, $CsPbCl_3$, $RbPbBr_3$, and $RbPbCl_3$. Examples of hybrid organic-inorganic perovskites include compounds such as $APbBr_3$ and $APbI_3$, wherein A is methylammonium and/or formamidinium.

Other suitable halide perovskites have the formula $amAMX_3$, where am is an alkyl diamine cation, an aromatic diamine cation, an aromatic azole cation, or a cyclic alkyl diamine cation. A is a monovalent alkylammonium cation or an alkali metal cation (Group I cation), X is a halide ion, and M is an octahedrally coordinated bivalent metal atom. The diamines can be primary, secondary, or tertiary diamines. Am can also represent a hydrazinediium cation. In some embodiments, am is an alkyl amine-functionalized aromatic azole, such as a histamine. In some embodiments, am is ethylenediamine, en. In these embodiments, the halide perovskites can be represented by the formula $enAMX_3$, wherein en is the ethylenediamine cation. In some embodiments, the am cation is an alkylene diammonium cation.

Other suitable inorganic semiconductor compounds have the formula $AB_2X_5$, where A represents Tl or In, B represents Sn or Pb, and X represents Br or I. The formula $AB_2X_5$ covers solid solutions that include both A elements, both B elements, and/or both X elements, as well as the end members of the formula. For the solid solutions, the formula can be written as $(Tl,In)(Sn,Pb)_2(I,Br)_5$. Thus, the formula covers the compounds $TlSn_2I_5$, $InSn_2I_5$, $TlSn_2Br_5$, $TlPb_2Br_5$, $TlPb_2Br_5$, $InSn_2Br_5$, $InPb_2I_5$, and $InPb_2Br_5$, as well as the solid solutions $Tl_{1-x}In_xSn_{2-y}Pb_yI_{5-z}Br_z$, $In_{1-x}Tl_xSn_{2-y}Pb_yI_{5-z}Br_z$, $Tl_{1-x}In_xSn_{2-y}Pb_yBr_{5-z}I_z$, $Tl_{1-x}In_x$-$Pb_{2-y}Sn_yI_{5-z}Br_z$, $Tl_{1-x}In_xPb_{2-y}Sn_yBr_{5-z}I_z$, $In_{1-x}Tl_x$-$Sn_{2-y}Pb_yBr_{5-z}I_z$, $In_{1-x}Tl_xPb_{2-y}Sn_yI_{5-z}Br_z$, and $In_{1-x}Tl_x$-$Pb_{2-y}Sn_yBr_{5-z}I_z$, where $0 \le x \le 0.5$; $0 \le y \le 1$; and $0 \le x \le 0.2.5$, and at least one of x, y, and z is greater than 0.

Still other suitable inorganic semiconductor compounds have the formula $Hg_3Q_2X_2$, where Q represents a chalcogen atom or a combination of chalcogen atoms (e.g., a combination of S, Se, and Te), and X represents a halogen atom or a combination of halogen atoms. Still other suitable inorganic semiconductor compounds include chalcohalides. For example, chalcogenides having the chemical formula $A_6BX_4$, wherein A is a metal, B is sulfur or selenium, and X is a halide can be used as the photoactive semiconductor. Members of this class of chalcohalides include thallium-based chalcohalides, such as $Tl_6SI_4$, $Tl_6SBr_4$ and $Tl_6SeI_4$. Still other suitable inorganic compounds have the formula $A_2P_2X_6$, where A represents Pb or Sn and X represents S or Se. Still other photoactive semiconductors include copper halide chalcogenides, such as $Cu_2I_2Se_6$ and its solid solutions, which include other halogens and/or other chalcogens.

Examples of these have the formulas $Cu_2I_xBr_{2-x}Se_yTe_{6-y}$ and $Cu_2I_xBr_{2-x}Se_yS_{6-y}$, where $0 \le x \le 1$ and $0 \le y \le 3$.

Various members of the aforementioned photoactive semiconductors, as well as other suitable photoactive semiconductors, can be categorized as inorganic compounds comprising at least three elements, wherein at least one of the three elements is an element from period five or period six of the Periodic Table of the Elements and another of the three elements is selected from S, Se, Te, Cl, F, I and Br. This category of semiconductors includes: $AB_2Q_4$ compounds with A=Cd, Hg or Pb; B=Al, Ga, or In; and Q=S, Se, or Te; $TlBQ_2$ compounds with B=Al, Ga, or In; and Q=S, Se, or Te; $(A_2Q)_m(AX)n$ with A=Na, K, Rb, Cs or Tl; Q=S, Se, or Te; and X=F, Cl, Br or I; $(AX)_m(BX_2)_n$ with A=Na, K, Rb, Cs or Tl; B=Cu, Zn, Cd, or Hg; and X=F, Cl, Br or I; $(Pn_2Q_3)_m(PnX_3)n$ with Pn=N, P, As, Sb or Bi; Q=S, Se, or Te; and X=F, Cl, Br or I; $(A_2Q)_m(Au_2Q)_n$ with A=Na, K, Rb, Cs or Tl; and Q=S, Se, or Te; $(A_2Q)_m(BQ)_n$ with A=Na, K, Rb, Cs or Tl; B=Cd or Hg; and Q=S, Se or Te; $(Tl_2S)_m(SnS_2)_n$; and $(A_2Q)_m(Pn_2Q_3)_n$ with A=Na, K, Rb, Cs or Tl; Pn=P, As, Sb, or Bi; and Q=S, Se, or Te.

A description of photoactive semiconductors and methods of making them can be found in U.S. Pat. No. 8,519,347 and PCT patent application publication number No. WO2017030624, the disclosures of which are incorporated herein by reference.

Examples of metals that can be used as anodes for a photoactive layer of $CsPbBr_3$ include gallium, chromium, titanium, indium and alloys thereof. Examples of metals that can be used as cathodes for a photoactive layer of $CsPbBr_3$ include gold, platinum, nickel, osmium and palladium, and alloys thereof.

EXAMPLES

EXAMPLE 1: In this example, a modified melt growth method was deployed for the improved crystal growth of $CsPbBr_3$ and $CsPbCl_3$. The resistivity of $CsPbBr_3$ is on the order of $10^9$-$10^{10}$ $\Omega \cdot cm$, depending on the purity level. This example demonstrates a new, effective device and method of collection that has been developed. $CsPbBr_3$ detectors with new designs were demonstrated to have clearly resolved the 59.5 keV $^{241}Am$ gamma ray spectrum and 122 KeV $^{57}Co$ spectrum, with a specific $\mu\tau$ of $>1 \times 10^{-3}$ $cm^2/V$, which is comparable to benchmark CdZnTe and CdTe crystals. A super-fine spectrum for a different radiative isotope was also analyzed for the first time, with energy resolution of 4.3% for a $^{57}Co$ gamma ray with a specific energy of 122 KeV.

Crystal Growth of $CsPbBr_3$

Obtaining a high-quality, single crystal of $CsPbBr_3$ was difficult due to the phase transition occurring at a relatively low temperature (<150° C.). The first phase transition from cubic (Pm-3m) to tetragonal ($P_4/mbm$) was a first-order phase transition, accompanied by volume and enthalpy changes with respect to temperature. Such discontinuous derivations during the phase transition-induced residual stress or mechanical deformations, which enhanced the initiation and propagation of cracks, sub-grain boundaries, or twins. Such structural defects behave like recombination or trapping centers and are detrimental to the detector performance, and thus should be prevented during crystal growth.

The kinetic parameters for the crystal growth processes are extremely important to obtaining a high-quality, single-crystal ingot. The overheating temperature, temperature gradient, in-situ annealing, and cooling strategy were evaluated carefully and tested accordingly. Dramatic improvements were achieved through the optimized, controlled crystal growth processes described here. The optimized temperature profile used for vertical Bridgman growth is indicated in FIG. 1, including a specific overheating temperature of 15 K, and a temperature gradient of 9 K/cm, due to the intrinsic thermal conductivity of $CsPbBr_3$ being quite small. Therefore, a smaller translation speed was desired for Bridgman growth. The single-crystal ingot was grown with a dropping velocity of 0.5 mm/h. The cooling strategy was also very important because of the low-temperature phase transition. The cooling rate used here was ~5 K/h, and a single-crystal ingot with a diameter of 11 mm and a length of 7 cm was obtained. The orange-red single crystal ingot was translucent and free of cracks or grain boundaries. The ingot was then cut and fabricated into different wafers with regular shapes. Owing to the relatively weak mechanical properties and cleavage characteristic of $CsPbBr_3$, the wafers were handled with great care to avoid chipping or cracks.

Crystal Growth of $CsPbCl_3$ $CsPbCl_3$ was synthesized directly by combining equal amount of CsCl and $PbCl_2$ through solid-state reaction. After synthesis, vertical Bridgman melt growth was employed to grow large single crystals. The silica crucible for Bridgman melt growth had a tapered shape and 11 mm inner diameter. It should be noted that the silica tube was flame-sealed with a residual pressure below $10^{-4}$ Torr. During Bridgman growth, the translation system is constructed to achieve very small but constant dropping velocity, in the range of 0.1~1 mm/h. The overheating temperature is set to 620° C. for 10 h. Once the quartz tube has completely passed through the temperature gradient region, the ingot was subsequently cooled down to room temperature in 20 h.

Device Design for $CsPbBr_3$ Devices

A new electrode configuration design for the $CsPbBr_3$ detectors was applied. The as-grown intrinsic $CsPbBr_3$ single crystal was shown to be a p type material, owing to its positive Seebeck coefficient at room temperature. Thus, the fermi level of $CsPbBr_3$ should have been close to the valence band. An energy level diagram of the conduction and valence bands of $CsPbBr_3$ is provided in Liang, J., et al., All-Inorganic Perovskite Solar Cells. *J. Am. Chem. Soc.* 2016, 138 (49), 15829-15832.

Figure 2B:
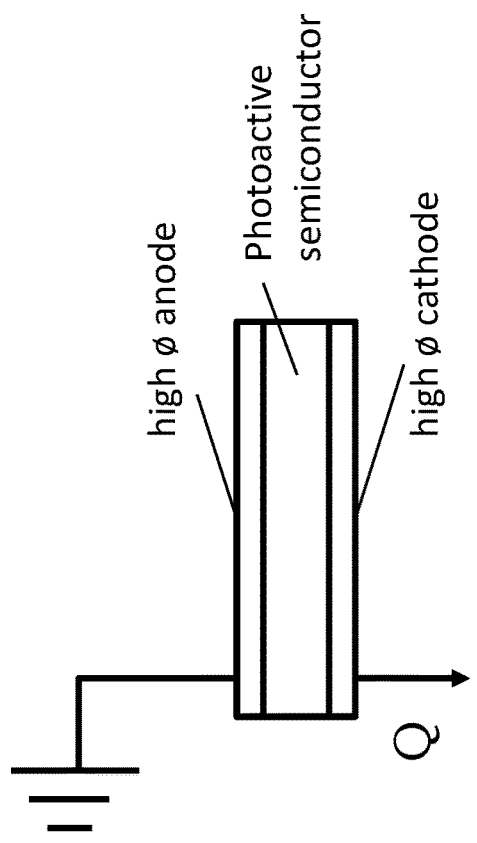
FIGS. 2A and 2B show device designs for two types of photodetectors that include $CsPbBr_3$ single crystals as photoactive layers.
Figure 2A:
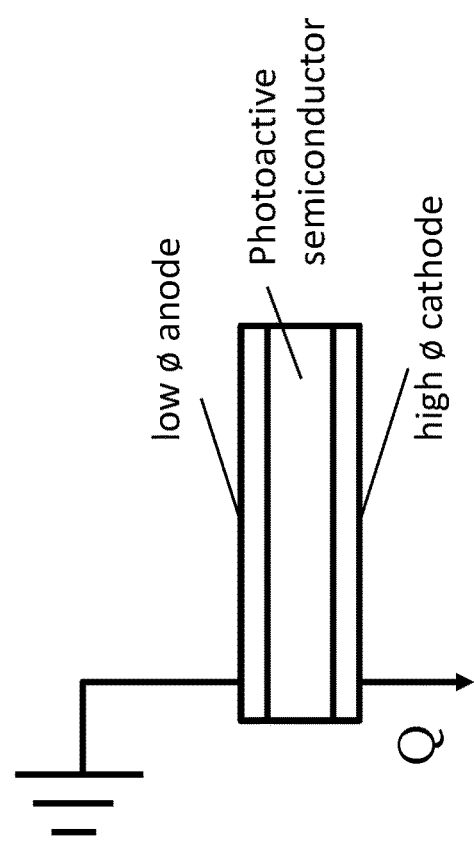
Figure 3A:
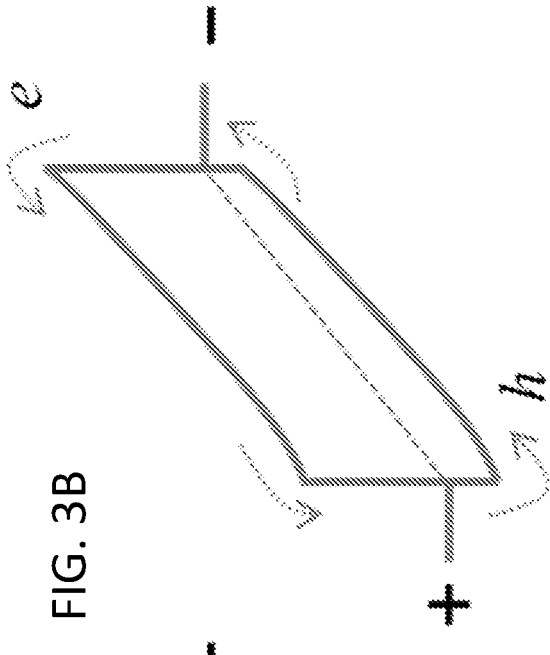
FIGS. 3A and 3B depict the mass absorption Coefficient and attenuation length for CsI, CZT and $CsPbBr_3$ crystals.
Figure 3B:
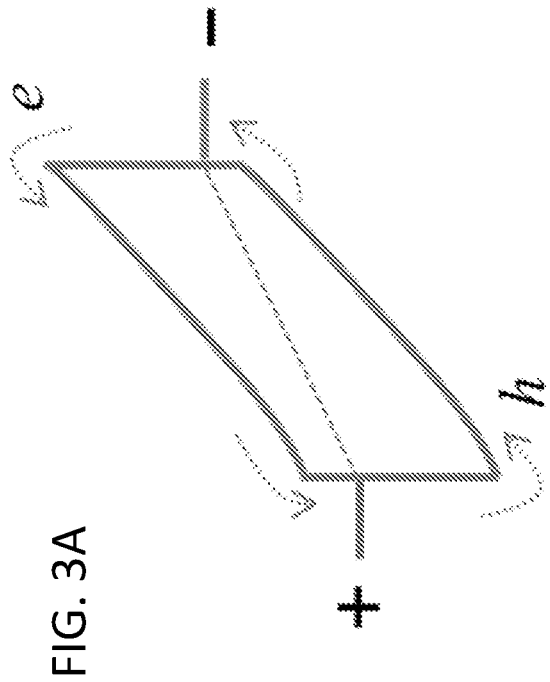
Figure 4B:
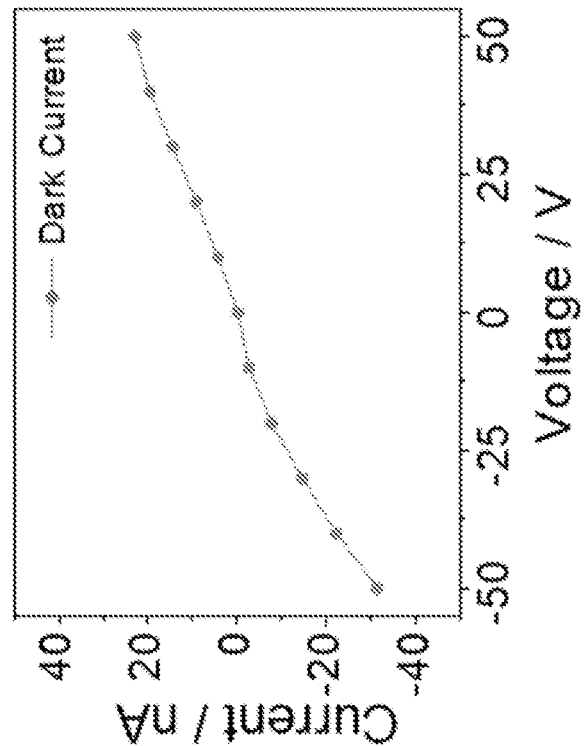
FIGS. 4A and 4B show the gamma ray response from the $CsPbBr_3$ detectors described in the Example. The cathode and anode electrodes were Au and Ga, respectively. The thickness of the sample was 0.88 mm.

As illustrated, there are two basic types (type I and type II) of planar devices for $CsPbBr_3$ (FIGS. 2A and 2B). For the type II design, the metals with high work functions are usually Au, Pt and Pd. With the type II design, the corresponding energy diagram under high bias is described in FIG. 3B. Owing to its small Schottky barrier, the hole can be easily injected into the crystal from the positive electrode through tunneling or a thermionic emission mechanism, which contributes to a large leakage current (FIG. 4B). For such a device, the leakage current is not stable over time, and usually increases continuously over time. Therefore, the planar device with the type II design cannot behave as a gamma ray detector. The resulting background noise from the leakage current of the detector dominates the spectrum.

Figure 4A:
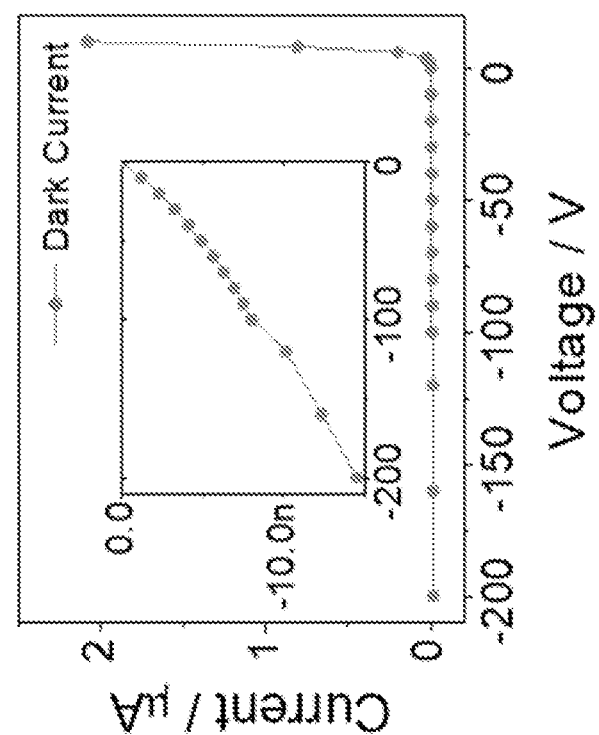

A new electrode design, as indicated in FIG. 2A, has been proposed here. A metal with a relatively low work function was utilized as an anode, while a metal with a relatively high work function served as the cathode. The high electrical voltage and signal collection were all from the cathode. The anode was grounded during detection. This design took into consideration the experimental p type character of $CsPbBr_3$. The energy diagram for this system has large Schottky barriers for both the electron and the hole at the semiconductor-metal interface while the device was biased, as shown is FIG. 3A. For this device, the I-V characteristic curve was not linear, but rather was like a diode. Under the negative side (FIG. 4A), the leakage current was quite small, around 15 nA, and under 200 V (corresponding to ~250 V/mm). The leakage was also very stable over time. While reserving the bias (FIG. 4A, positive side), the leakage current increased dramatically owing to the injection from both positive and negative electrodes.

Poly[bis(4-phenyl)(2,5,6-trimethylphenyl)amine (PTAA) was used as a hole transport layer materials for better hole collection. The use of PTAA increased the Schottky barrier slightly; however, it did not change the energy resolved spectrum significantly.

The electrode configuration based on the above new design concept is not confined to planar-type detectors; it can also be applied to other type of detectors, such as co-planar detectors, pixel detectors and hemisphere type detectors.

Device Characterization

CsPbBr$_3$ is a high Z compound with an effective atomic number of 65.9, which is much higher than CdTe (50.2) and comparable to HgI$_2$ (68.9). The cross-section for photoelectric absorption in a material of atomic number Z varies as $Z^n$. Therefore, the higher atomic number promises higher stopping power for X and gamma ray photons. The attenuation coefficients of CsPbBr$_3$ are higher than those of CZT, especially in the high energy region. For instance, for $^{57}$Co γ-rays with characteristic energy of 122 keV, the attenuation lengths are 1.70 mm for CdTe/CZT, and 1.20 mm for CsPbBr$_3$, confirming the higher stopping power for high-energy photons. Therefore, thinner crystals can be used to absorb hard radiation with the same energy.

Figure 5:
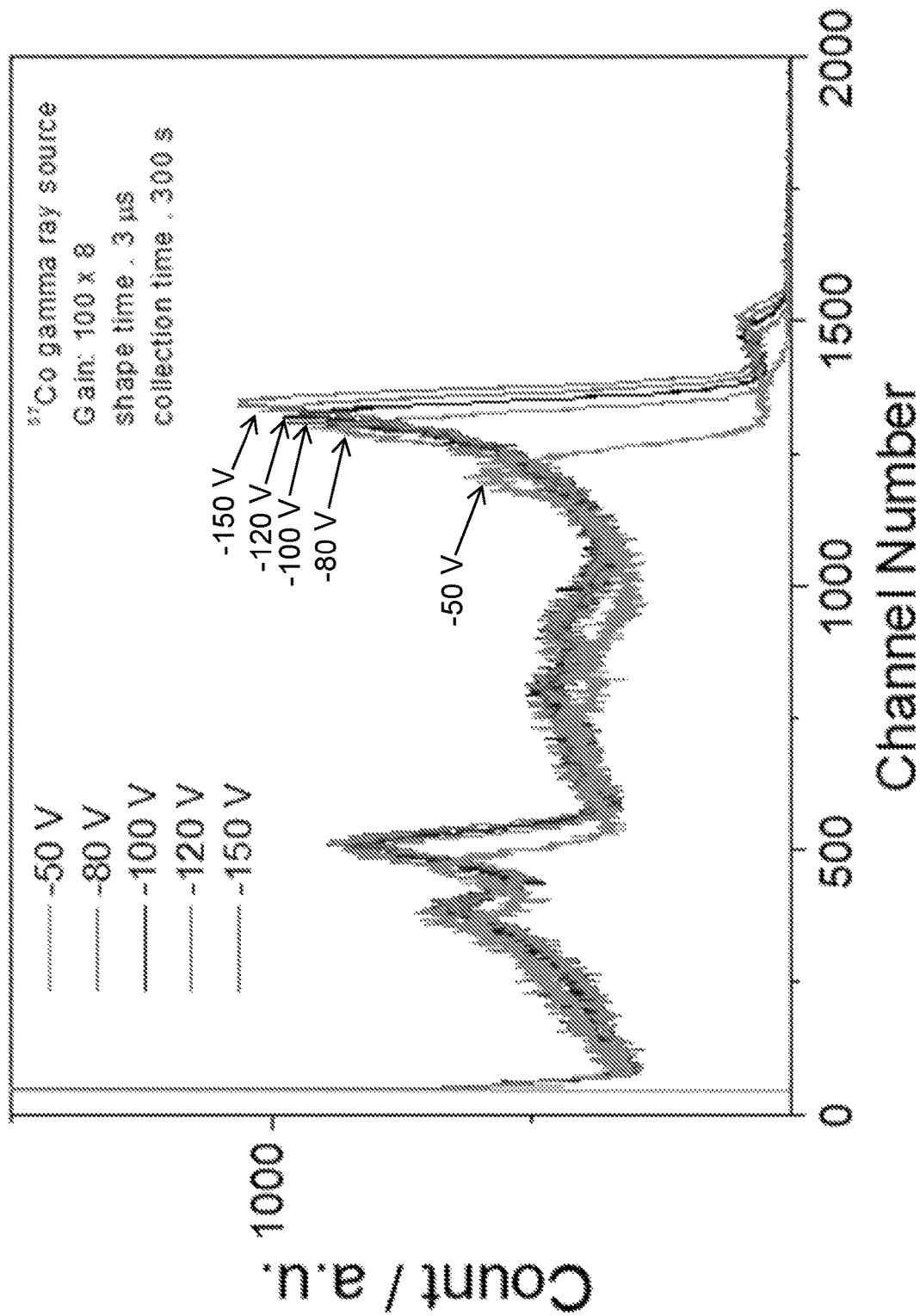
FIG. 5 shows photodetection spectra for the photodetector in the Example. Increasing the applied bias resulted in the spectra being shifted to higher channel numbers, indicating improvement in the charge collection efficiency (CCE) of the device.
Figure 6:
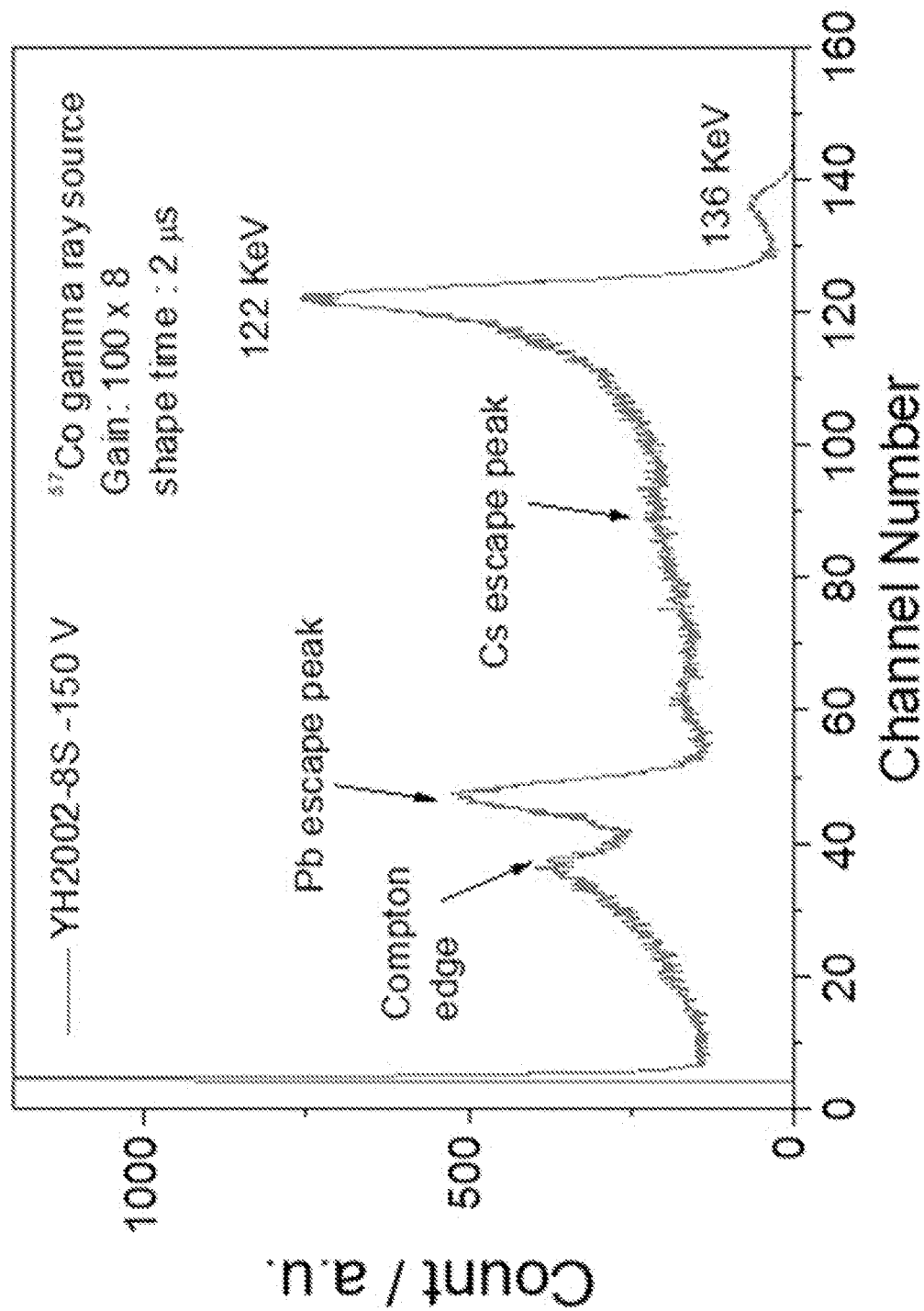
FIG. 6 shows a super fine $^{57}Co$ gamma ray spectrum for the photodetector in the Example. The spectrum has an extremely low contribution from the leakage current noise. The corresponding energy resolution of this detector in terms of full width at half maximum (FWHM) was 4.3% under −150 V.

Under the $^{241}$Am gamma source (59.5 keV), the CsPbBr$_3$ device showed a well resolved spectroscopic spectrum. Owing to the intensity of the $^{241}$Am gamma source, the accumulation time was usually longer than the $^{57}$Co gamma ray source. During the measurement, the Ga anode was under irradiation; thus, the measured signal was generated mainly by hole drift through the thickness of device. The spectra also indicated the distinct transport properties of the electron and the hole. While increasing the applied bias, the spectra shifted to the higher channel number (FIG. 5), indicating an improvement in the charge collection efficiency (CCE). A super fine $^{57}$Co gamma ray spectrum with extremely low contribution from the leakage current noise is indicated in FIG. 6, and the corresponding energy resolution of this detector in terms of full width at half maximum (FWHM) was 4.3% under −150 V.

Figure 7:
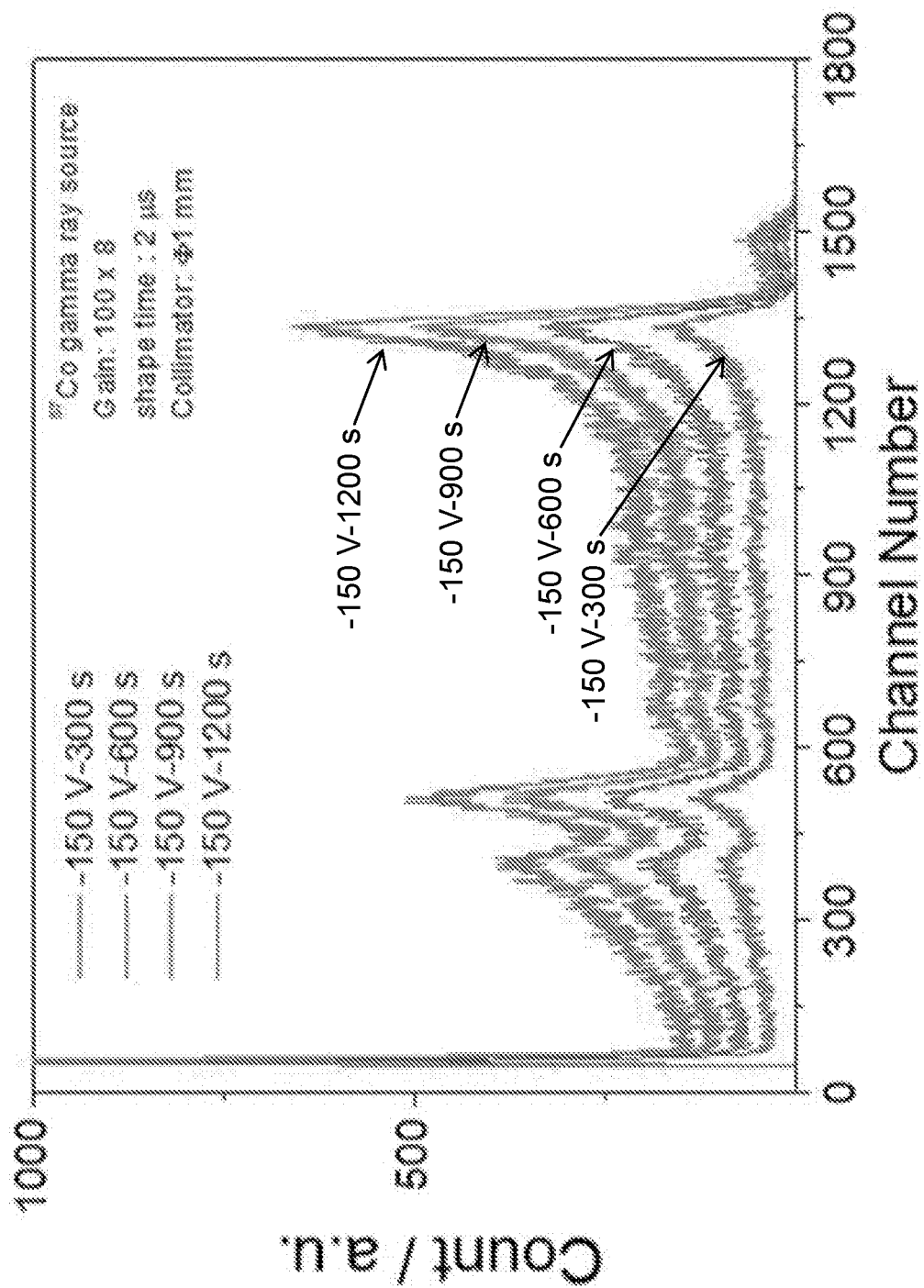
FIG. 7 shows that, over a continuous working period of 1200 s, the peak channel number and count rate for the $^{57}Co$ gamma ray spectrum for the photodetector in the Example did not shift or change, indicating polarization was absent for the newly designed device.

The device also showed very stable response with time. Over a continuous working period of $_{1200}$ s, the peak channel number and count rate for the $^{57}$Co gamma ray spectrum did not shift or change (FIG. 7), indicating polarization was absent for the newly designed device.

Figure 8:
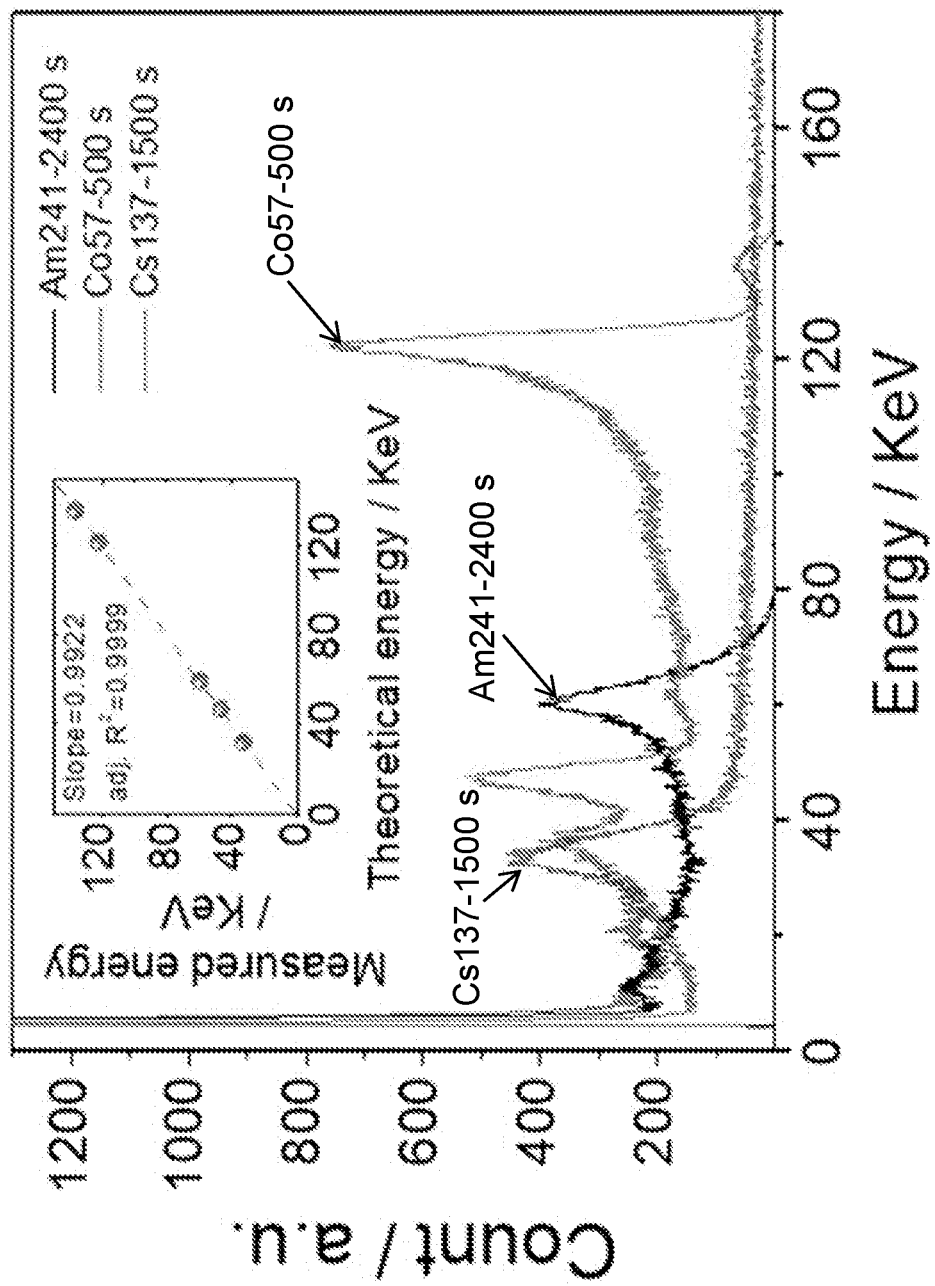
FIG. 8 shows the energy-calibrated spectrum obtained according to the $^{57}Co$ peak position (122 keV). A series of peaks from different radioactive isotopes was clearly resolved, such as 32 keV, 47 keV, 59.5 keV and 136 keV. The linearity (or proportionality) response of the device was quite good, as indicated in the inset in FIG. 8.

The energy-calibrated spectrum (FIG. 8) was also obtained according to the $^{57}$Co peak position (122 keV). A series of peaks from different radioactive isotopes was clearly resolved, such as 32 keV, 47 keV, 59.5 keV and 136 keV. The linearity (or proportionality) response of the device was quite good, as indicated in the inset in FIG. 8. This was very important for the application of radioactive isotope classification.

The mobility-lifetime product evaluated here for the hole and electron were 1.34×10$^{-3}$ and 8.77×10$^{-4}$ cm$^2$/V, respectively, according to the Hecht equation. (See, e.g., He, Y., et al., Defect Antiperovskite Compounds Hg$_3$Q$_2$I$_2$ (Q=S, Se, and Te) for Room-Temperature Hard Radiation Detection. *J. Am. Chem. Soc.* 2017, 139 (23), 7939-7951.) The transport property was much better for the hole, which is quite unique among the materials in this field. The mobility-lifetime product values for CsPbBr$_3$ were found to be comparable to those of the benchmark CdTe and CZT materials when determined using the same method.

The carrier drift mobilities of the crystals were evaluated using the rise time t$_r$ of transient waveforms from the preamplifier under a $^{241}$Am gamma ray source. (See, e.g., Sellin, P. J., et al., Drift mobility and mobility-lifetime products in CdTe:Cl grown by the travelling heater method. *IEEE Trans. Nucl. Sci.* 2005, 52 (6), 3074-3078; and Szeles, C., CdZnTe and CdTe materials for X-ray and gamma ray radiation detector applications. *physica status solidi (b)* 2004, 241 (3), 783-790.) For photo-generated carriers drifting across the thickness, the mobility μ was given by $$\mu = \frac{d^2}{Ut_r},$$

where U is the applied bias across the thickness d, and t$_r$ is the transit time of the carriers through the device. The electron and hole mobility values obtained were 363 and 52 cm$^2$/(V·s), respectively.

A similar spectroscopic response has been reproducibly obtained from different batches of materials. The robustness and reproducibility of the new device design have improved the CsPbBr$_3$ to the level of the ideal room temperature radiation detector, with a low cost, an ability to easily scale up, and high performance.

EXPERIMENTAL SECTION

Materials. Chemicals in this work were used as obtained, including: (i) Cesium bromide, 99.999%, Sigma-Aldrich; (ii) Lead bromide, 99.999%, Sigma-Aldrich.

Bridgman growth of CsPbBr$_3$ from its melt. Polycrystalline CsPbBr$_3$ was prepared directly from CsBr and PbBr$_2$ by solid-state reaction. For a small-amount (<40 g) Bridgman growth run, the synthesis and growth was usually done in the same quartz tube to reduce the unintended impurity contamination from multi-step operations. The tube for such growth had a tapered shape and a Φ13 mm diameter. For a large-amount (>100 g) Bridgman growth run, the synthesis and growth processes were done separately. First, the polycrystalline CsPbBr$_3$ was further purified by fast Bridgman runs. Then only the middle part of the polycrystalline ingot was used for the following growth. The tube for such Bridgman growth also had a tapered shape and a Φ25 mm diameter. All the reactions for synthesis and crystal growth were done in a vacuum, with an original pressure less than 10$^{-4}$ Torr (at room temperature). Any moisture contamination of the starting materials and ternary compound was likely to lead to lead oxide and off-stoichiometric issues. The quartz tube was then placed on a support rod which moved downwards with a geared dropping system in a two-zone vertical furnace. This translation system was constructed to achieve a very small but constant dropping velocity, in the range of 0.1~1 mm/h. For the Bridgman growth, the quartz tube was heated up to 580° C. in 10 h and held at that temperature for 12 h. In practice, 20~30 K superheating helps to reduce the excess nucleation centers and suppress the possibility of the formation of structural defects. The temperature profile (FIG. 1) for the Bridgman growth was also optimized to avoid any thermal-induced cracks and possible constitutional super-cooling, and to enhance the single crystal yield of the $CsPbBr_3$. The measured temperature gradient in FIG. 1 was about 9 K/cm. Once the quartz tube had been completely passed through the temperature gradient region, the ingot was then cooled down to 200° C. in 20 h subsequently. Owing to the existence of phase transitions, the ingot was then cooled down to room temperature with a very slow cooling rate of 2~5 K/h.

Mechanical Processing and Polishing. The $CsPbBr_3$ crystal ingots were cut into rounded wafers perpendicular to the growth direction or desired shapes of 0.5~2 mm thickness using a Struers Accutom-50 waferizing saw equipped with a 300 μm wide diamond-impregnated blade. The sample surface was polished mechanically with successively fine SiC grinding papers down to a 1 μm particle size. Owing to the low hardness of $CsPbBr_3$, the pressing pressure during mechanical polishing was kept low enough to avoid inducing post-growth structural defects.

Electrode preparation. The as-polished $CsPbBr_3$ crystals were rinsed in acetone to remove the possible surface contamination before the electrode deposition. Two methods were used to prepare the Au electrode: brushing Au paint, and thermal evaporation through a shielding mask onto $CsPbBr_3$ samples. The Ga electrode was prepared simply by brushing liquid Ga metal onto the surface of the crystal. The electrodes were then connected by a Cu wire to the outer collection circuit. An Al electrode (low work function metal) deposited by thermal evaporation was also tried; however, the Al contact was not stable in air and tended to peel off quickly upon exposure to air. Therefore, the contact had to be encapsulated to protect it from exposure to air. Other low and high work function metals are listed in FIG. 9.

Electrical Properties and Detector Performance Measurements. The I-V characteristic curves were measured in the dark using a Keithley 6517B electrometer. The resistivity was then calculated from the I-V characteristics in the low bias range.

For detector performance measurements, the gamma ray sources employed were $^{241}Am$ 59.5 KeV, 0.2 mCi $^{57}Co$ 122 KeV, and 5 μCi $^{137}Cs$ 662 KeV γ-ray sources. In each measurement, the as-prepared detectors were enclosed in a shielding box connected to an eV-550 preamplifier. A negative bias varying from −4 to −300 V was applied to the bottom contact, while the γ-ray source was irradiated from the top cathode contact. The signals from the preamplifier were further amplified and shaped by the ORTEC amplifier (Model 572A) with a gain of 100-500 and a shaping time of 1-10 μs. The final signals were subsequently evaluated by a dual 16 K input multichannel analyzer (Model ASPEC-927) and read into the MAESTRO-32 software, which generated and displayed the response spectrum. The mobility was estimated using pulse height spectroscopy. For the mobility evaluation, signals from the preamplifier, instead of transferring to the ORTEC amplifier, were collected by using a homemade interface based on National Instruments software, which could capture the complete transient waveforms directly from the preamplifier with a maximum time resolution of 4 ns. Each transient waveform was analyzed to determine its rise time $t_r$, which corresponded to a transit time between 10% and 90% of the amplitude of the transient pulses.

EXAMPLE 2: This example illustrates that the electrical and detector performance of $CsPbBr_3$ and $CsPbC_{13}$ can be modified through intentionally doping. Doping can take place done during the Bridgman growth from a melt or during solution-phase growth. The doping elements can be selected from elements of the chemical periodic table having atomic numbers, Z, in the range from from 1 to 83, including elements or compounds from Group 13 to Group 17 of the periodic table of the elements.

Bridgman growth of Doped $CsPbBr_3$ ($CsPbBr_3$:Dopant) from its melt. The binary compounds CsBr, $PbBr_2$ and TlBr were used to synthesize the Tl-doped polycrystalline $CsPbBr_3$ by a solid-state reaction. The chemical ratio for CsBr and $PbBr_2$ was 1:1, while TlBr was added with a ratio of 0.05%-0.5% (atomic %; at. %). The temperature for the synthesis was set at 580° C. After synthesis, the Tl-doped polycrystalline $CsPbBr_3$ was used for Bridgman growth. The silica tube for Bridgman growth was of 11 mm inner diameter with a conically shaped end. All processes for synthesis and crystal growth were done in vacuum, with an original pressure of less than $10^{-4}$ Ton (at room temperature). The Bridgman growth procedure for Tl-doped $CsPbBr_3$ was the same as that for the non-doped $CsPbBr_3$. The silica tube was heated to 590° C. in 10 h and held at that temperature for 12 h for overheating (15-30 K) to avoid heterogeneous nucleation. Once the silica tube completely passed, with a dropping speed of 0.5 to 2 mm $h^{-1}$, through the temperature gradient region (with a typical temperature gradient of 5 to 20 K $cm^{-1}$), the resulting ingot was cooled down to 200° C. in 20 h. The ingot was then cooled down to room temperature with a cooling rate of 2 to 5 K $h^{-1}$.

The resistivity of as-grown crystals (YH2088) was over $10^9$ Ω·cm, which is at least one order of magnitude higher than intrinsic $CsPbBr_3$ crystals.

Doping with elements other than Tl can be carried out using the same general procedure. The Table in FIG. 10 lists other possible dopant elements, along with illustrative concentration (in at. %) that can be used. As shown in the table of FIG. 10, the crystals were doped with other dopants (e.g., Te (0.5% at. %), Bi (0.2% at. %), TlBr (0.5% at. %), $PbCl_2$ (5% at. %), Se (0.2% at. %), $PbCl_2$ (0.5% at. %), $PbCl_2$ (1% at. %), $PbCl_2$ (5% at. %), In (0.2% at. %), Ga (0.2% at. %), Sb (0.2% at. %), Pb and $PbBr_2$ (1% at. % for Pb and 1% at. % for $PbBr_2$)). Through such doping, the crystals demonstrated high resistivities of at least $10^9$ Ω·cm.

For example, additional Pb metal can be introduced as a dopant into the stochiometric ternary compound for the purpose of defect compensation (see sample YH2010 in FIG. 10). The Pb-doped $CsPbBr_3$ detector showed comparable or higher detector performance relative to the detector made from the non-intentionally doped crystals; achieving ~5% energy resolution under 122 keV $^{57}Co$ γ ray.

In addition, iodine (I) doping of $CsPbBr_3$ single crystal (YH2015, 0.1% at. % $PbI_2$) was performed. Upon exposure to a $^{57}Co$ γ-ray source, the I-doped $CsPbBr_3$ detector with Ga and Au electrodes also delivered a series of excellent $^{57}Co$ γ-ray spectra with extremely low contributions from leakage current noise and achieved an energy resolution of 5.3% under −350 V.

Pure $CsPbCl_3$ and Br-doped $CsPbCl_3$ single crystals were also grown using the Bridgman method, as indicated in the table of FIG. 10. The measured electrical resistivity for the pure $CsPbCl_3$ single crystal was at least ~$1.7 \times 10^9$ Ω·cm. Based on the bias-dependent channel number of the γ-ray peaks, the $(\mu\tau)_h$ calculated according to the Hecht equation is at least $3.2 \times 10^{-4}$ $cm^2/V$. The energy resolution achieved by the pure $CsPbCl_3$ with Ga and Au contacts was ~16% for 122 keV $^{57}Co$ γ ray.

Figure 11A:
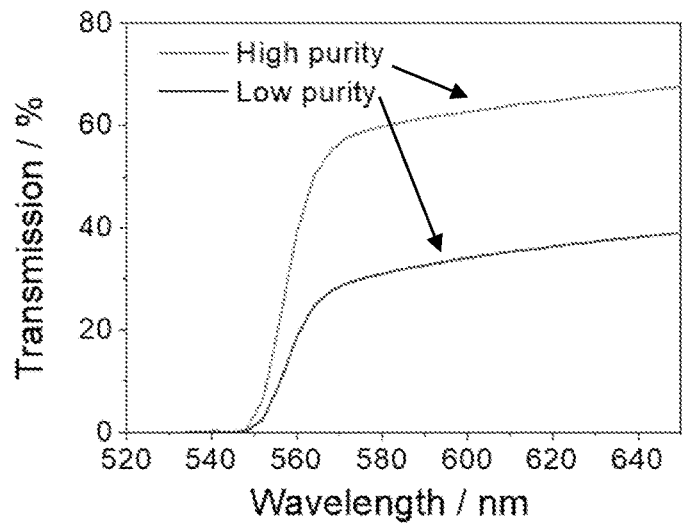
FIG. 11A. Optical performance dependence on the impurities levels inside a $CsPbBr_3$ crystals.
Figure 11B:
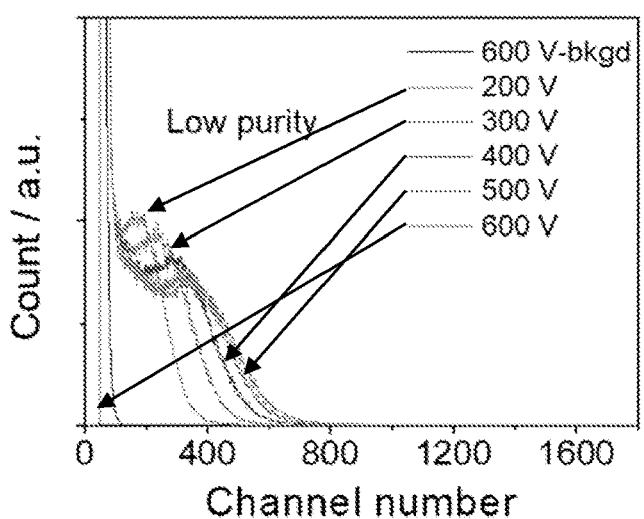
FIG. 11B and 11C. Detection performance dependence on the impurities levels inside a $CsPbBr_3$ crystals. The detectors were with Ga and Au electrodes.
Figure 11C:
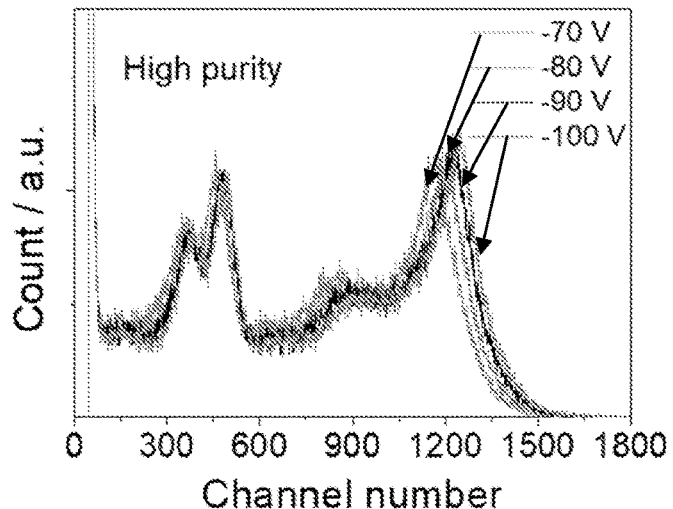

Zone-refining for purification. Crystals grown with different purity levels showed distinct electrical and, thus, detection properties (FIGS. 11A-11C). The "high purity" sample contained less than 10 ppm total impurities according to a glow discharge mass spectrometry (GDMS) analysis, while the "low purity" sample contained more than 30 ppm impurities. The higher impurity level reduced transmission level of the incident light with wavelength over 570 nm from >60% to ~30% (FIG. 11A), which was also confirmed by a color change of the crystals. A detector made from the "low purity" sample demonstrated much worse detector performance than that made from the "high purity" sample, as shown in FIGS. 11B and 11C. The hole mobility-lifetime product for "low purity" and "high purity" samples were $<10^{-4}$ cm2/(Vs) and $>10^{-3}$ cm2/(Vs), respectively.

To purify and further improve the crystal quality, a three-zone horizontal zone-refining furnace was used. As an example, the temperature for each zone can be set to be identical in the range of 600-650° C., the translation speed was 0.001 to 0.1 mm/s. Once the entire crucible containing $CsPbBr_3$ or $CsPbCl_3$ was passed through the three zones, the crucible was moved to the starting point in 10 s to start another pass-through. Thus, one pass implies the ingot had been directionally melted and solidified three times owing to the three heating zones. After zone-refining, impurities accumulated in a black part at the last-freezing part of the ingot along the zone-refining direction. The black end was removed and the remaining clear part was used for the subsequent Bridgman growth.

Figure 12A:
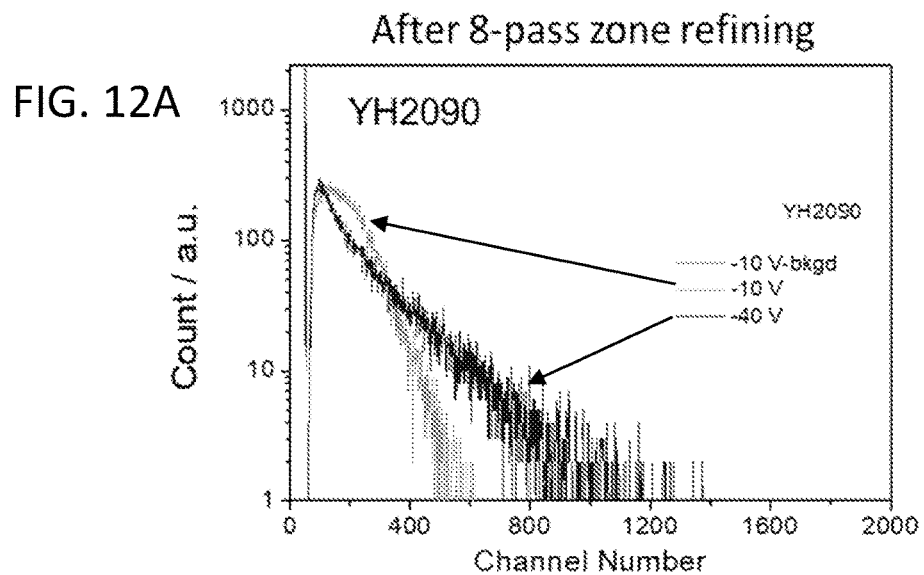
FIG. 12A-12C. Zone refining of $CsPbBr_3$ through a three-zone furnace. The detector performance under $^{57}Co$ γ-ray spectra obtained by $CsPbBr_3$ detectors fabricated from an ingot after zone refining with a 0.002 mm/s translation speed (FIG. 12A) and after subsequent Bridgman growth (FIG. 12B). The detectors were fabricated with Ga and Au electrodes (Type I).
Figure 12B:
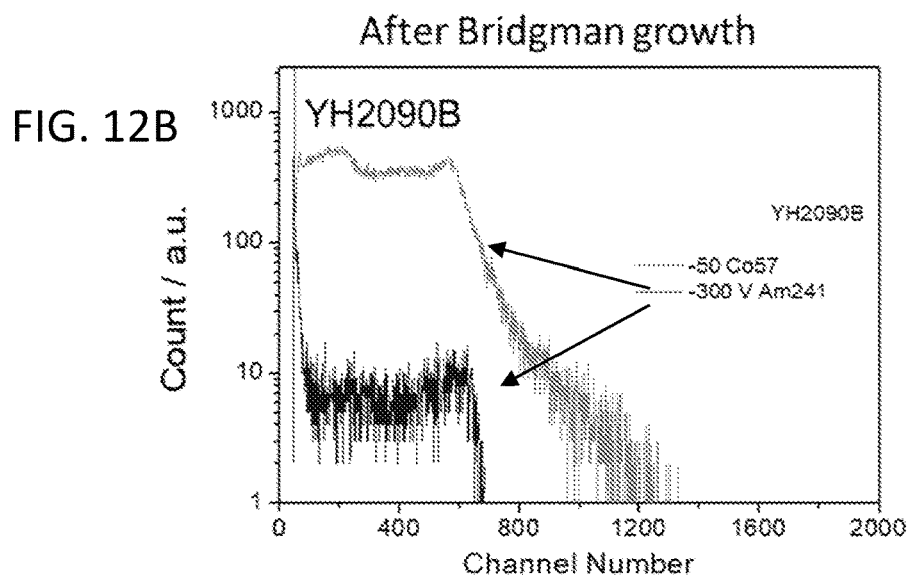
Figure 12C:
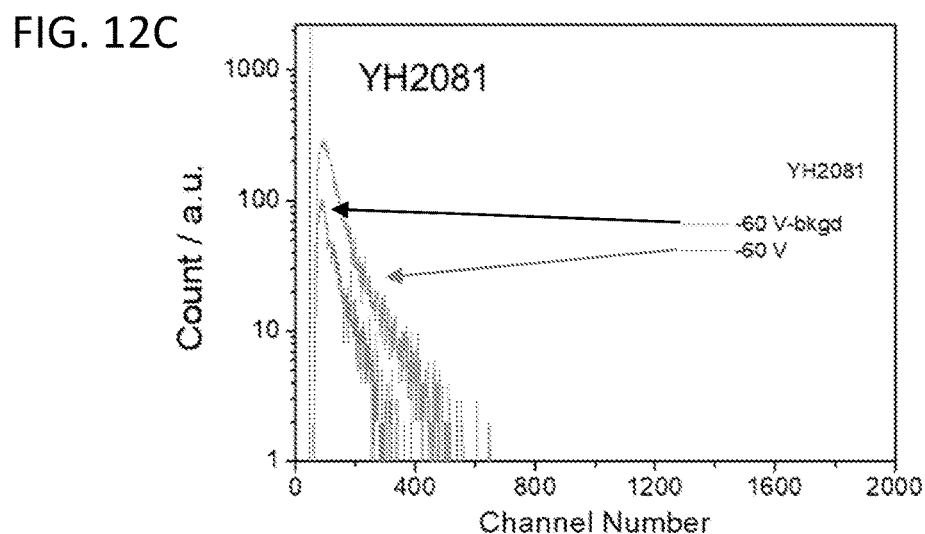

After the zone-refining, Bridgman growth was conducted. The detector performance is shown in FIGS. 12A, 12B, and 12C. The purity for the starting materials for the sample in FIGS. 12A-12C were 5N for CsBr and 4N8 for $PbBr_2$. The detector made from the clear part after zone-refining showed distinct gamma ray response from the background. Bridgman growth resulting in a detector that demonstrated excellent detector performance (FIG. 12B).

The same procedure was carried out on starting materials with lower purities (No. YH2081, 3N for CsBr and 4N8 for $PbBr_2$); however, after 10 passes and Bridgman growth (same to YH2090B), the detector made from the sample YH2081 ingot did not have a high gamma ray response, as demonstrated in FIG. 12C, demonstrating that the impurity levels inside the single crystals of $CsPbBr_3$ and $CsPbCl_3$ played an important role in determining the detector performance. At least over 4N or higher purify level was required to achieve the highest detector performance in this illustrative example, in terms of producing a resolved peak under gamma ray exposure and possessing a high mobility-lifetime product $>10^{-4}$ cm$^2$/(Vs).

Figure 13B:
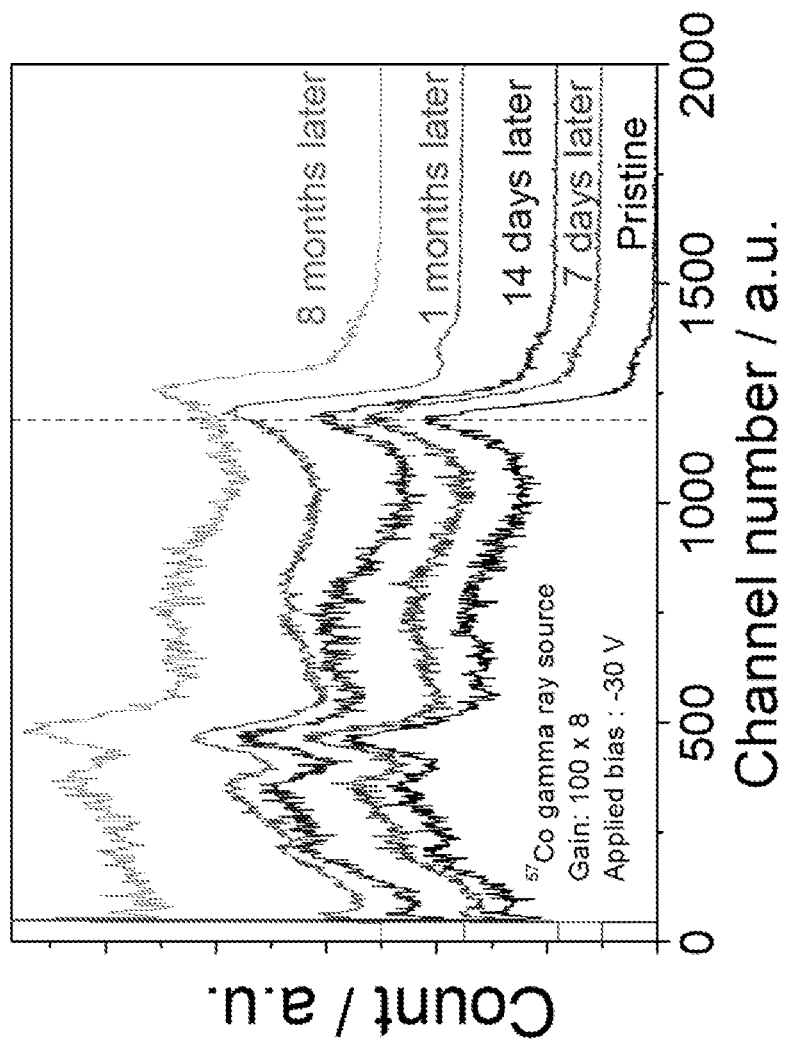
FIG. 13B shows the detector performance after encapsulation with wax in air with RH % of 50-70% over a period of 8 months. Note that the slightly increase in peak channel number (8 months later) results from the slight fine-gain increase of the amplifier.
Figure 13A:
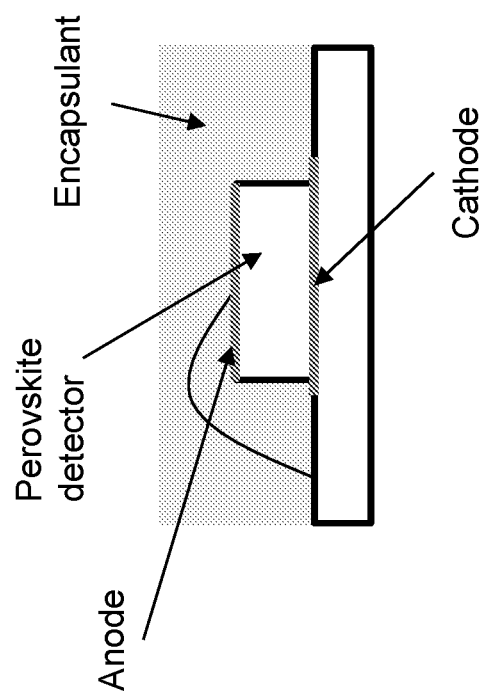
FIG. 13A is a schematic diagram of a detector that is encapsulated in wax.

Encapsulation of $CsPbBr_3$ and $CsPbCl_3$ detector for long-term use. A $CsPbBr_3$ single crystal can be stable under atmospheric conditions for years. However, they will decompose into binaries in contact with water. Thus, the $CsPbBr_3$ device might decompose in humid conditions. The initial energy resolution of a $CsPbBr_3$ detector with Ga and Au contacts under a relative humidity (RH) of 60-70% degraded from ~5% to over 10% in 2 weeks. After encapsulation with wax, the $CsPbBr_3$ detector was stable for over 8 months, with a negligible change in energy resolution (~5-6%), as indicated in FIG. 13B. The encapsulated detector (FIG. 13A) also showed stable electrical properties over time. The dark current was also unchanged with time. Thus, encapsulation of a $CsPbBr_3$ detector to protect it from exposure to air and water can be used to achieve long-term stability of the detector performance. Polydimethylsiloxane (PDMS) is another suitable encapsulant.

The word "illustrative" is used herein to mean serving as an example, instance, or illustration. Any aspect or design described herein as "illustrative" is not necessarily to be construed as preferred or advantageous over other aspects or designs. Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of growing a doped $CsPbX_3$ single crystal, the method comprising:
   forming a melt comprising CsX, $PbX_2$, where X is Br or Cl, and a doping species comprising a dopant element from Group 13 or Group 17 of the periodic table; and
   growing crystalline doped $CsPbX_3$ from the melt via vertical Bridgman growth.

2. The method of claim 1, wherein X is Br.

3. The method of claim 2, wherein the dopant species comprises $PbI_2$ or $PbCl_2$.

4. The method of claim 2, wherein the dopant species comprises TlBr.

5. The method of claim 2, wherein the dopant species comprises Pb.

6. The method of claim 1, wherein X is Cl.

7. The method of claim 6, wherein the dopant species comprises $PbBr_2$.

8. A method of growing a doped $CsPbX_3$ single crystal, the method comprising:
   forming a melt comprising CsX, $PbX_2$, where X is Br or Cl, and a doping species comprising Se; and
   growing crystalline doped $CsPbX_3$ from the melt via vertical Bridgman growth.

9. A method of growing a doped $CsPbX_3$ single crystal, the method comprising:
   forming a melt comprising CsX, $PbX_2$, where X is Br or Cl, and a doping species comprising $CsSnBr_3$; and
   growing crystalline doped $CsPbX_3$ from the melt via vertical Bridgman growth.

* * * * *